(12) United States Patent
Khare

(10) Patent No.: US 10,142,721 B2
(45) Date of Patent: Nov. 27, 2018

(54) CLAMPING AUDIO SIGNAL PATHS

(71) Applicant: Cirrus Logic International Semiconductor Ltd., Edinburgh (GB)

(72) Inventor: Rupesh Khare, Newbury (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/439,323

(22) Filed: Feb. 22, 2017

(65) Prior Publication Data

US 2017/0251294 A1    Aug. 31, 2017

(30) Foreign Application Priority Data

Apr. 7, 2016   (GB) .................................. 1605910.7

(51) Int. Cl.
*H04R 1/10* (2006.01)
*H03G 3/34* (2006.01)
(Continued)

(52) U.S. Cl.
CPC ............. *H04R 1/1041* (2013.01); *H03F 3/00* (2013.01); *H03F 3/187* (2013.01); *H03G 3/341* (2013.01);
(Continued)

(58) Field of Classification Search
CPC .... H04R 1/1041; H04R 3/00; H04R 2420/01; H03K 19/018507; H03K 19/00315;
(Continued)

(56) References Cited

U.S. PATENT DOCUMENTS 5,283,484 A    2/1994 Brehmer et al.
7,321,238 B1 *  1/2008 Reid ................ H03K 19/00315
                                                      326/23
(Continued)

FOREIGN PATENT DOCUMENTS

CN    204761691 U    11/2015
EP      0095902 A1   12/1983
(Continued)

OTHER PUBLICATIONS

International Search Report and Written Opinion of the International Searching Authority, International Application No. PCT/GB2017/050478, dated Apr. 19, 2017.
(Continued)

*Primary Examiner* — Yogeshkumar Patel
(74) *Attorney, Agent, or Firm* — Jackson Walker L.L.P.

(57) ABSTRACT

This application describes methods and apparatus for selectively clamping a signal path (106) for an analog audio signal to a clamp voltage, e.g. ground. Voltage clamping circuitry (200) is disclosed having a first switching device (201) in series with a second switching device (202) between a node of the signal path and the clamp voltage. The clamping circuitry is configured to be operable in: a first state where the first and second switching devices are both on to electrically connect the signal path to the clamp voltage; and also a second state to electrically disconnect the signal path from the clamp voltage. In the second state one of the first and second switching devices is configured to block conduction when the voltage at said node of the signal path is positive and the other switching device is configured to block conduction when the voltage at said node of the signal path is negative.

19 Claims, 1 Drawing Sheet

(51) Int. Cl.
*H03K 19/0185* (2006.01)
*H04R 3/00* (2006.01)
*H03F 3/00* (2006.01)
*H03F 3/187* (2006.01)
*H03K 5/08* (2006.01)

(52) U.S. Cl.
CPC ..... *H03G 3/348* (2013.01); *H03K 19/018507* (2013.01); *H04R 3/00* (2013.01); *H03F 2200/03* (2013.01); *H03F 2200/441* (2013.01); *H04R 2420/01* (2013.01)

(58) Field of Classification Search
CPC ....... H03K 19/0027; H03K 19/018521; H03K 17/063; H03K 17/005; H03K 5/08; H03G 3/341
USPC .................................................. 327/407, 309
See application file for complete search history.

(56) References Cited

U.S. PATENT DOCUMENTS

| | | | |
|---|---|---|---|
| 9,088,274 B1 | 7/2015 | Chaudhry et al. | |
| 2007/0132501 A1* | 6/2007 | Koch | H03K 17/005 327/407 |
| 2008/0074171 A1 | 3/2008 | Bhattacharya et al. | |
| 2011/0163613 A1 | 7/2011 | Kato et al. | |
| 2015/0162901 A1 | 6/2015 | Lu et al. | |
| 2015/0214937 A1* | 7/2015 | Chaudhry | H03K 5/08 327/318 |

FOREIGN PATENT DOCUMENTS

| | | |
|---|---|---|
| EP | 0453651 A1 * | 10/1991 |
| EP | 1865598 A2 | 12/2007 |
| GB | 2120903 A | 12/1983 |
| JP | S56119517 A | 9/1981 |

OTHER PUBLICATIONS

Combined Search and Examination Report under Sections 17 and 18(3), Application No. GB1605910.7, dated May 12, 2016.
Search Report under Section 17(6) relating to claims 16-18, dated Jul. 26, 2016, Application No. GB1605910.7.
Search Report under Section 17(6) relating to claim 15, dated Jul. 26, 2016, Application No. GB1605910.7.
Search Report under Section 17(6) relating to claim 19, dated Jul. 26, 2016, Application No. GB1605910.7.
Combined Search and Examination Report under Sections 17 and 18(3), Application No. GB1702963.8, dated Mar. 21, 2017.
Combined Search and Examination Report, UKIPO, Application No. GB1802331.7, dated Mar. 27, 2018.

* cited by examiner

CLAMPING AUDIO SIGNAL PATHS

This application relates to methods and apparatus for audio output circuits and especially for voltage clamping of an audio signal path, and in particular for clamping of an audio signal path for outputting an audio signal to an audio accessory such as a set of headphones.

BACKGROUND

Many electronic devices include an audio output circuit for outputting an analogue audio signal to an accessory or peripheral apparatus that can be removably connected to the electrical device in use. For example, for many portable electronics devices a set of headphones or similar audio accessory may be removably connected to the device, to be driven by an analogue audio signal output from that device. FIG. 1 illustrates an electronic device 100, which will be referred to as the host device, that in use can be connected to an accessory audio apparatus 101, such as a headset, e.g. headphones or earbuds or the like. In use the accessory apparatus 101 may be removably connected to the host device 100 via a suitable connector, e.g. a mating connector such as plug and receptacle arrangement. One well known connector for audio accessories is a 3.5 mm jack plug and jack socket arrangement, whether a four pole (TRRS) or three pole (TRS) connector, but other connectors are known, such as USB type connectors, and may be used for analogue audio signals.

The host device 100 includes an audio output stage 102 for driving an audio load, such as a speaker 103, of an accessory apparatus 101 when connected. The audio output stage 102 may thus be connected to a contact or pole 104 of a connector of the host device 101, e.g. a jack socket, which is arranged to make electrical contact with a corresponding contact or pole 105 of a connector, e.g. jack plug, of a suitable accessory apparatus when connected. There is thus an audio signal path 106 between the output stage 102 and contact 104 of the connector.

Typically when not being used, e.g. without a suitable audio accessory apparatus connected, the audio output stage 102 is inoperative and typically the audio signal path 106 between the output stage 102 and contact 104 is clamped to ground. Switch 107 is thus provided so as to clamp the audio signal path to ground when closed and opened in use when driving an audio output signal to a connected accessory apparatus.

SUMMARY

Embodiments of the present disclosure relate to methods and apparatus for voltage clamping of an audio signal path when not use.

According to an aspect of the present invention there is provided a voltage clamp for an analogue audio signal path comprising:
  an n-channel transistor in series with a p-channel transistor between a node of the signal path and a clamp voltage;
  the n-channel transistor being configured such that when driven by a positive gate drive voltage above a first threshold the n-channel transistor substantially blocks conduction when the node of the signal path is at a positive voltage;
  the p-channel transistor being configured such that when driven by a negative gate drive voltage with a magnitude above a second threshold the p-channel transistor substantially blocks conduction when the node of the signal path is at a negative voltage.

The n-channel transistor may comprise a drain terminal connected to the node of the signal path, a source terminal connected to the p-channel transistor and a bulk terminal connected to the source terminal of the n-channel transistor. The p-channel transistor may comprise a drain terminal connected to the clamp voltage, a source terminal connected to the n-channel transistor and a bulk terminal connected to the drain terminal of the p-channel transistor.

Alternatively the p-channel transistor may comprise a drain terminal connected to the node of the signal path, a source terminal connected to the n-channel transistor and a bulk terminal connected to the source terminal of the p-channel transistor. The n-channel transistor may comprise a drain terminal connected to the clamp voltage, a source terminal connected to the p-channel transistor and a bulk terminal connected to the drain terminal of the n-channel transistor.

The circuitry may be configured to be operable in: a first state where the n-channel transistor and p-channel transistor are both on to electrically connect the signal path to the clamp voltage; and also a second state electrically disconnect the signal path from the clamp voltage wherein in the second state the n-channel transistor is configured to block conduction when the voltage at said node of the signal path is positive and the p-channel transistor is configured to block conduction when the voltage at said node of the signal path is negative. The first state may be enabled when the gate drive voltage for the n-channel transistor is positive with a magnitude greater than said first threshold and the gate drive voltage for the p-channel transistor is negative with a magnitude greater than said second threshold. The second state may be enabled when the gate drive voltages for the n-channel transistor and the p-channel transistor are each substantially at ground. The circuit may comprise a controller for generating the gate drive voltages for the n-channel transistor and the p-channel transistor.

According to another aspect of the present invention there is provided voltage clamping circuitry for selectively clamping a signal path for an analogue audio signal to a clamp voltage comprising:
  a first switching device in series with a second switching device between a node of the signal path and the clamp voltage;
  the clamping circuitry being configured to be operable in:
  a first state where the first and second switching devices are both on to electrically connect the signal path to the clamp voltage; and also
  a second state electrically disconnect the signal path from the clamp voltage wherein in the second state the first switching device is configured to block conduction when the voltage at said node of the signal path is positive and the second switching device is configured to block conduction when the voltage at said node of the signal path is negative.

The first switching device may comprise a first transistor. The first transistor may comprise a drain terminal connected to the node of the signal path and a source terminal connected to the second switching device. A bulk terminal of the first transistor may be connected to the source terminal of the first transistor.

The second switching device may comprise a second transistor. The second transistor may comprise a drain terminal connected to the clamp voltage and a source terminal connected to the first switching device. A bulk terminal of the second transistor may be connected to the drain terminal of the second transistor.

One of the first and second switching devices may comprise a p-channel transistor and the other of the first and second switching devices may comprise an n-channel transistor. In one embodiment the first switching device is an n-channel transistor and the second switching device is a p-channel transistor. In another embodiment the first switching device is a p-channel transistor and the second switching device is an n-channel transistor The first and second switching devices may be configured to be controlled by first and second switch control signals respectively. The first state may be enabled when the first switch control signal is positive with a magnitude greater than a first threshold value and the second switch control signal is negative with a magnitude greater than a second threshold value. The second state may be enabled when the first and second switch control signals are each substantially at ground. The circuitry may comprise a controller for generating said first and second switch control signals.

In some embodiments the clamp voltage may be ground, e.g. substantially zero volts.

The audio signal path may be a signal path for outputting an audio signal, in use, to an accessory apparatus that may be removably connected to the signal path. The audio signal path may be connected to a contact of a connector of a host device. The audio signal path may be connected to an audio output stage.

In some embodiments the peak-to-peak voltage swing of the audio signal path, in use, is greater than the voltage rating of at least one of the first and second switching devices.

Embodiments also provide voltage clamping circuitry for selectively clamping a signal path for an analogue audio signal to a clamp voltage comprising:
  an n-channel transistor in series with a p-channel transistor between a node of the signal path and the clamp voltage;
  wherein a source terminal of the n-channel transistor is connected to a source terminal of the p-channel transistor;
  wherein a bulk terminal of the n-channel transistor is connected to its source terminal; and
  wherein a bulk terminal of the p-channel transistor is connected to its drain terminal.

In one embodiment the drain of the n-channel transistor is connected to the node of the signal path and the drain of the p-channel transistor is connected to the clamp voltage. In another embodiment the drain of the p-channel transistor is connected to the node of the signal path and the drain of the n-channel transistor is connected to the clamp voltage.

In a further aspect there is provided a voltage clamp for an analogue audio signal path comprising:
  an n-channel transistor coupled to a node of the audio signal path; and a p-channel transistor coupled between the n-channel transistor and a clamp voltage node;
  wherein a bulk terminal of the n-channel transistor is electrically connected to the midpoint of series connection with p-channel transistor; and
wherein a bulk terminal of the p-channel transistor is electrically connected to the clamp voltage node.

In a further aspect there is provided a voltage clamp for an analogue audio signal path comprising:
  a p-channel transistor coupled to a node of the audio signal path; and an n-channel transistor coupled between the p-channel transistor and a clamp voltage node;
  wherein a bulk terminal of the p-channel transistor is electrically connected to the midpoint of series connection with n-channel transistor; and
  wherein a bulk terminal of the n-channel transistor is electrically connected to the clamp voltage node.

BRIEF DESCRIPTION OF THE DRAWINGS

The invention will now be described by way of example only with reference to the accompanying drawings, of which.

DESCRIPTION

Figure 1:
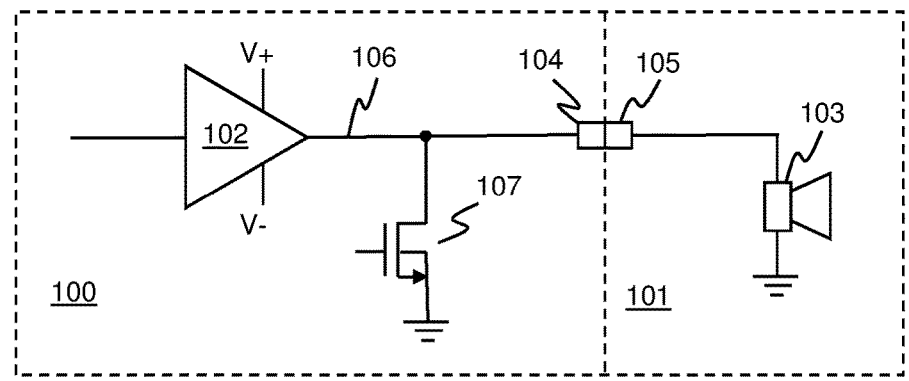
FIG. 1 illustrates an audio output stage for driving an audio load of a connected accessory apparatus.

As discussed above FIG. 1 illustrates a conventional arrangement for a host device 100 for outputting an analogue audio signal to an accessory apparatus 101 when connected, via a contact 104 of the host device. A switch 107, such an NMOS transistor, is provided to clamp signal path 106, and hence the contact 104, to a desired voltage, usually ground, when not in use, e.g. when no accessory apparatus 101 is connected. Switch 107 is thus closed when the signal path 106 is to be disabled and opened when the signal path 106 is used to output an analogue audio signal.

When outputting an audio signal the switch 107 is open (or off). One side of the switch 107 is connected to the audio signal path 106 and thus swings in voltage with the analogue audio signal. The other side of the switch 107 is connected to the desired voltage, i.e. ground. The voltage across the switch thus varies with the output signal, which for a ground referenced audio signal, may vary between peak positive and peak negative values. Conventionally, for driving headphones and the like, the peak-to-peak voltage swing for an audio signal output via such a signal path 106 is relatively low and a standard transistor such as an NMOS transistor may be used for switch 107. By peak-to-peak is meant the variation between the maximum positive signal and maximum negative signal.

It has been appreciated that in some instances however it may be desirable to be able to output audio signals with a greater peak-to-peak voltage swing, say of the order of several volts. In one example the positive and negative supplies, V+ and V−, for the output stage 102 may be of the order of +3.3V and −3.3V. This can provide a relatively high peak-to-peak voltage swing for the audio signal.

Additionally there is a general desire to reduce the size of integrated circuit components as much as possible, especially for portable devices, and thus increasingly processing technologies that allow for smaller feature sizes, i.e. process nodes of smaller size, are being used for fabrication. Smaller transistors however generally may have a lower voltage rating, i.e. a rating with regard to the voltage stress the device is designed to be able to handle.

As noted above in conventional arrangements the switch 107 may be implemented by an NMOS transistor, as illustrated in FIG. 1, with its source terminal connected to ground and its bulk terminal coupled to the source terminal, so also at ground. When the switch 107 is off the gate voltage may be held at or near ground. In such an arrangement if the audio signal goes to a relatively large negative value, say around −3V, the voltage between the bulk and drain may be sufficient to forward bias a body diode of the transistor between the p-type bulk and n-type drain, allowing for unwanted leakage from ground.

This could in theory be prevented by biasing the bulk of the transistor to be at or near the negative supply voltage V− but in such a case when the audio signal swings to a high positive value the voltage difference between the drain terminal and bulk terminal will be relatively high. For instance if the peak positive signal value is of the order of 3V and the bulk is biased to −3.3V then there may, at times, be greater than 6V across the transistor. Equally if the gate voltage is driven to around the positive supply voltage V+ when the switch 107 is on then voltage between the gate terminal and the bulk terminal will be relatively high.

It has therefore been recognised that there may be situations where it is wished to clamp an audio signal path to a desired voltage, when not in use, where the audio signal path is for, in use, output of an analogue audio signal with a relatively high peak-to-peak voltage swing and/or is implemented in a circuit fabricated using a relatively small process node and a conventional clamp switch may not be adequate.

Embodiments of the present disclosure thus relate to methods and apparatus for clamping an audio signal path to a desired voltage, e.g. ground, and especially where the audio signal path is a signal path for outputting a ground referenced analogue audio signal to an accessory apparatus, e.g. a signal path for driving headphones or the like.

Embodiments of the present invention relate to voltage clamping circuitry that comprises first and second switching devices in series between a node of the signal path and the clamp voltage. The first and second switching devices are active switching devices, i.e. devices such as transistors where the device can be controllably varied between different switching states, e.g. in response to a signal at a control terminal. The switching devices may, for example, be MOS transistors or the like where a control applied to one terminal, e.g. a gate terminal, may controllably allow current flow between two other terminals. One of the first switching devices comprises an n-channel device and the other switching devices comprises an p-channel device. The source of the first switching device may be connected to the source of the second switching device. The drain of the first switching device may be coupled to the signal path node with the drain of the second switching device coupled to the clamp voltage. The bulk terminal of the first switching device may be coupled to its source terminal, i.e. to the mid-point of the series connection. The bulk terminal of the second switching device is coupled to its drain, i.e. to the clamp voltage.

When voltage clamping is required both switching devices may be controlled to an on state so as to clamp the node of the signal path to ground. When the signal path is not to be clamped both devices can be controlled to an off state and at least one of the switching devices will block conduction at relatively high positive voltages at the signal node and at least the other switching device will block conduction at relatively high negative voltages at the signal node.

Figure 2:
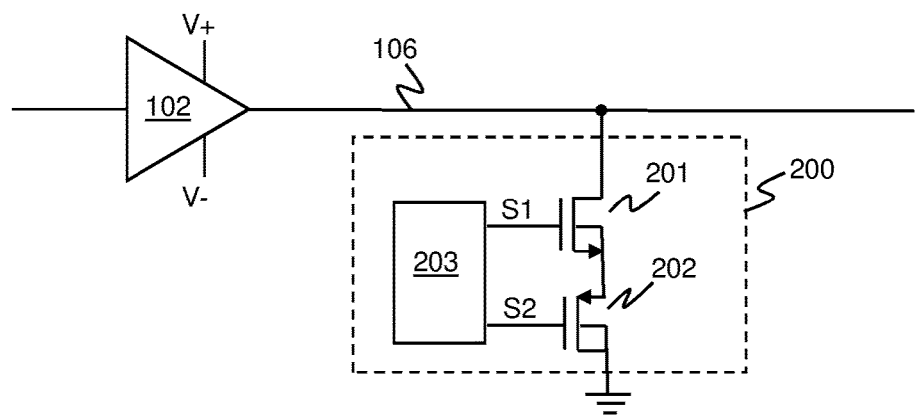
FIG. 2 illustrates voltage clamping circuitry according to an embodiment of the invention.

FIG. 2 illustrates one embodiment of voltage clamping circuitry 200 for clamping the signal path 106. The voltage clamping circuitry 200 comprises a first switching device 201 in series with a second switching device 202. The first switching device is electrically connected to the signal path 106 and the second switching device is connected to the desired clamp voltage, in this example ground (zero volts).

The voltage clamping circuitry 200 may be operable in a first state, which may be seen as an on-state, to clamp the signal path to the desired clamp voltage. In this first (on) state both the first and second switching devices 201 and 202 are on, i.e. conductive, simultaneously. The voltage clamping circuitry 200 is also operable in a second state, which may be seen as an off-state, to disconnect the signal path 106 from clamp voltage. As will be described in more detail below in the second (off) state the first switching device 201 may effectively block conduction through the clamping circuitry 200 during any period of positive voltage of the signal path 106 and the second switching device 202 may effectively block conduction through the clamping circuitry 200 during any period of positive voltage of the signal path 106. This combination thus prevents any substantial current flow through the voltage clamping circuitry 200 and means that the voltage across the first and second switching devices in the second state are no greater than the magnitude of the positive and negative signal voltages respectively.

In this example the first switching device 201 is an n-channel transistor, such as an NMOS, and the second switch 202 is a p-channel transistor, such as a PMOS. In this example the drain of the NMOS 201 is connected to the signal path 106 and the source of NMOS 201 is coupled to the second switching device 202. The bulk terminal of the NMOS 201 is connected to the source terminal.

The source terminal of PMOS 202 is connected to the first switching device 201 and the drain of PMOS 202 is coupled to the clamp voltage, in this case ground. The bulk terminal of PMOS 202 is connected to the drain terminal, and hence in this example connected to ground.

The gate of NMOS 201 is driven by a first switch control signal S1 and the gate of PMOS 202 is driven by a second switch control signal S2. The switch control signals S1 and S2 may be generated by a controller 203 which controls the state of the switch control signals S1 and S2 in accordance with the required state of the voltage clamping circuitry 200.

When the clamping circuitry 200 is operated in the first (on) state to clamp the signal path 106 to the clamp voltage, e.g. ground, the first and second gate control signals are driven to relatively high positive and negative voltages respectively. For instance the first switch control signal S1 may be set to a value +V1 and the second switch control signal S2 may be set to a negative value −V1. In some examples the values +V1 and −V1 may be set to be equal to the positive and negative supply voltages provides to the output stage 102.

The gate voltage of the PMOS 202 is thus sufficiently low for PMOS conduction and the gate voltage of the NMOS 201 is thus sufficiently high for NMOS conduction. Both switching elements are thus on and conductive and the signal path 106 is thus clamped to ground.

When the clamping circuitry 200 is operated in the second (off) state to disconnect the signal path 106 from the reference voltage the first and second switch control signals S1 and S2 may be set to be substantially equal to zero volts, i.e. ground. This prevents substantial conduction through the voltage clamping circuitry 200.

As noted above in use the signal path voltage will vary depending on the audio signal being output and may vary between being positive and negative within a certain peak-to-peak range. When the audio signal is positive the gate-source voltage of the first switching device, NMOS 201 will be below the relevant threshold voltage and thus the NMOS will block conduction. The PMOS 202 can be seen as effectively being on and thus the bulk of NMOS 201 will be at ground. The maximum voltage across the NMOS 201 will thus be equal to the magnitude of the peak positive audio signal voltage across the drain and source/bulk terminals.

When the audio signal is negative the NMOS 201 may be seen as effectively being on but the gate-source voltage of PMOS 202 will be above the relevant threshold such that the PMOS 202 is off and blocks conduction. The maximum voltage across the PMOS 202 will thus be equal to the magnitude of the peak negative audio signal voltage across the source—drain/bulk terminals or equal to the magnitude of the voltage of the second switch control signal between the gate terminal and bulk.

In this way the series combination of the first and second switching devices 201 and 202 of the clamping circuitry 200 collectively block any substantial current flow whether the audio signal is positive or negative. As noted the first switching device 201 acts to prevent any current flow when the audio signal is positive and the second switching device 202 acts to prevent any current flow when the audio signal is negative. The maximum voltage across the first switching device is defined by the magnitude of the peak positive audio signal and the maximum voltage across the second switching device is defined by the magnitude of the peak negative audio signal.

Thus, for example if the positive and negative supply voltages for the output stage 102 were of the order of +3.3V and −3.3V and the audio signal had a peak-to-peak voltage swing of around 6V, each of the first and second switching devices 201 and 202 could have an individual voltage rating of about 3.3V and the voltage clamping circuitry 200 would operate to clamp the signal path 106 to ground when required but also to prevent substantial conduction through the clamping circuitry 200 when the signal path 106 is in use, without undue voltage stress on the switching devices.

The discussion above in relation to FIG. 2 refers to an NMOS transistor 201 as the first switching device in series with a PMOS transistor 202 as the second switching device. It will be appreciated that each switching device may, in practice be implemented by a number of individual elements in parallel. As used herein the term the term switching device may thus refer to a switching arrangement or switching circuit, although in some embodiments there may be a single transistor. It will also be appreciated that other types of transistor could be used. Other combinations of switching elements could be arranged to provide the same functionality.

Figure 3:
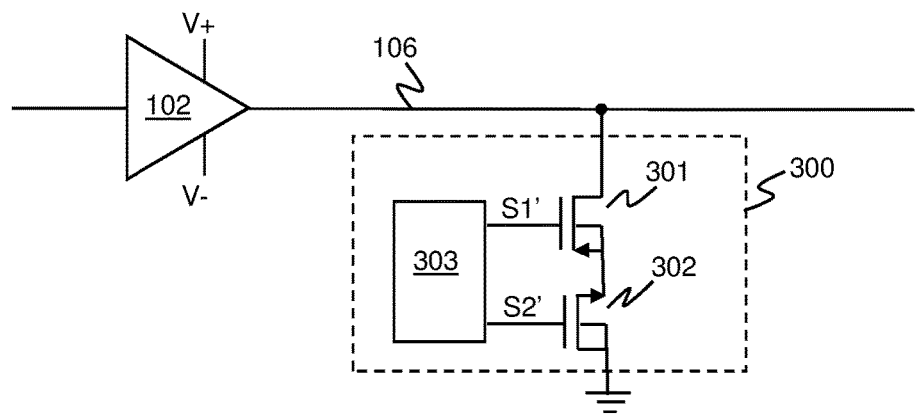
FIG. 3 illustrates voltage clamping circuitry according to another embodiment of the invention.

FIG. 3 illustrates another example of voltage clamping circuitry 300 for clamping the signal path 106. Again the clamping circuitry has a first and switching devices in series, e.g. first and second transistors 301 and 302, with the sources of the two switching transistors coupled together and the drain of the first transistor 301 coupled to the signal path and the drain of the second transistor 302 coupled to the clamp voltage. The bulk terminal of first transistor 301 is coupled to its source terminal to be tied to the midpoint voltage and the bulk of the second transistor 302 is coupled to its drain terminal to be tied to the clamp voltage. In this example the first switching device 301 is a PMOS transistor and the second switching device 302 is an NMOS transistor. The first and second transistors 301 and 302 are again controlled by a controller 303 that generates gate control signals S1' and S2' in the same manner as described above with respect to FIG. 2, except in this instance the relative values of the gate control signals are swapped. That is the control signal S1' for the first switching device, i.e. PMOS 301, will have the same value as described above the control signal S2 for PMOS 302 and the control signal S2' for the second switching device, i.e. NMOS 302, will have the same value as described above the control signal S1 for NMOS 301. The embodiment of FIG. 3 operates in the same way as that described for FIG. 2, just with the positions of the PMOS and NMOS swapped and the gate control signals swapped accordingly.

The discussion in relation to FIGS. 2 and 3 refers to clamping the signal path to ground, where the signal path is for a ground referenced analogue audio signal, i.e. where the midpoint, quiescent voltage is ground. In some embodiments a different clamping voltage could be used if required, for instance if the signal path were used for a signal of one polarity only, with a quiescent midpoint voltage is equal to a defined value $V_{mid}$, it may be wished to clamp the signal path to $V_{mid}$ when not in use. In which case the clamp voltage may be equal to $V_{mid}$ and reference to positive and negative in the foregoing discussion should be interpreted with regard to being above or below the midpoint voltage $V_{mid}$.

Embodiments are particularly applicable to audio signal paths of a host device for outputting an analogue audio signal to a connector of the host device to drive an audio load of a connected accessory. In particular the voltage clamping circuitry may be implemented for voltage clamping of a headphone amplifier of a host device and/or a contact or pole of a connector that, in use, may be used for analogue audio output. The principles however are applicable to any signal path and embodiments may be implemented on a signal path between an audio output stage and an audio load of the host device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. A voltage clamp for selectively clamping an analogue audio signal path to a clamp voltage of a predefined value, the voltage clamp comprising:
   an n-channel transistor in series with a p-channel transistor between a node of the analogue audio signal path and the clamp voltage, wherein a voltage at the node of the analogue audio signal path is equal to a voltage of an analogue audio signal carried by the analogue audio signal path, and wherein a source terminal of the n-channel transistor is connected to a source terminal of the p-channel transistor;
   the n-channel transistor being configured such that when driven by a positive gate drive voltage above a first threshold the n-channel transistor substantially blocks conduction through the voltage clamp when the node of the signal path is at a positive voltage with respect to a predefined midpoint voltage;
   the p-channel transistor being configured such that when driven by a negative gate drive voltage with a magnitude above a second threshold the p-channel transistor substantially blocks conduction through the voltage clamp when the node of the signal path is at a negative voltage with respect to the predefined midpoint voltage.

2. A voltage clamp as claimed in claim 1 wherein the n-channel transistor comprises a drain terminal connected to the node of the signal path and a bulk terminal connected to the source terminal of the n-channel transistor.

3. A voltage clamp as claimed in claim 2 wherein the p-channel transistor comprises a drain terminal connected to the clamp voltage and a bulk terminal connected to the drain terminal of the p-channel transistor.

4. A voltage clamp as claimed in claim 1 wherein the p-channel transistor comprises a drain terminal connected to the node of the signal path and a bulk terminal connected to the source terminal of the p-channel transistor.

5. A voltage clamp as claimed in claim 4 wherein the n-channel transistor comprises a drain terminal connected to the clamp voltage and a bulk terminal connected to the drain terminal of the n-channel transistor.

6. A voltage clamp as claimed in claim 1, wherein the voltage clamp is configured to be operable in:
a first state where the n-channel transistor and p-channel transistor are both on to electrically connect the signal path to the clamp voltage; and also
a second state to electrically disconnect the signal path from the clamp voltage wherein in the second state the n-channel transistor is configured to block conduction when the voltage at said node of the signal path is positive and the p-channel transistor is configured to block conduction when the voltage at said node of the signal path is negative.

7. A voltage clamp as claimed in claim 6 wherein said first state is enabled when the gate drive voltage for the n-channel transistor is positive with a magnitude greater than said first threshold and the gate drive voltage for the p-channel transistor is negative with a magnitude greater than said second threshold.

8. A voltage clamp as claimed in claim 6 wherein said second state is enabled when the gate drive voltages for the n-channel transistor and the p-channel transistor are each substantially at ground.

9. A voltage clamp as claimed in claim 6 to comprising a controller for generating said gate drive voltages for the n-channel transistor and the p-channel transistor.

10. A voltage clamp as claimed in claim 1 wherein the predefined value of said clamp voltage is ground.

11. A voltage clamp as claimed in claim 1 wherein said audio signal path is configured to carry the analogue audio signal to an accessory apparatus that may be removably connected to the signal path.

12. A voltage clamp as claimed in claim 1 wherein said audio signal path is connected to a contact of a connector of a host device.

13. A voltage clamp as claimed in claim 1 wherein said audio signal path is connected to an audio output stage.

14. A voltage clamp as claimed in claim 1 wherein a peak-to-peak voltage swing of the analogue audio signal carried by the audio signal path in use is greater than the voltage rating of at least one of the n-channel transistor and the p-channel transistor.

15. Voltage clamping circuitry for selectively clamping an analogue audio signal path to a clamp voltage of a predefined value, the voltage clamping circuitry comprising:
an n-channel transistor in series with a p-channel transistor between a node of the analogue audio signal path and the clamp voltage;
wherein a source terminal of the n-channel transistor is connected to a source terminal of the p-channel transistor;
wherein a bulk terminal of the n-channel transistor is connected to its source terminal;
wherein a bulk terminal of the p-channel transistor is connected to its drain terminal; and
wherein the voltage clamping circuitry further comprises a controller configured to generate a control signal to drive a gate terminal of the n-channel transistor and to generate a control signal to drive a gate terminal of the p-channel transistor.

16. Voltage clamping circuitry for selectively clamping an analogue audio signal path to a clamp voltage of a predefined value, the voltage clamping circuitry comprising:
an n-channel transistor in series with a p-channel transistor between a node of the signal path and the clamp voltage;
the clamping circuitry being configured to be operable in:
a first state where the n-channel transistor and the p-channel transistor are both on to electrically connect the signal path to the clamp voltage; and also
a second state to electrically disconnect the signal path from the clamp voltage wherein in the second state the n-channel transistor is configured to block conduction when the voltage at said node of the signal path is positive and the p-channel transistor is configured to block conduction when the voltage at said node of the signal path is negative.

17. Voltage clamping circuitry for selectively clamping an analogue audio signal path to a clamp voltage of a predefined value, the voltage clamping circuitry comprising:
an n-channel transistor in series with a p-channel transistor between a node of the signal path and the clamp voltage;
the clamping circuitry being configured to be operable in:
a first state where the n-channel transistor and the p-channel transistor are both on to electrically connect the signal path to the clamp voltage; and also
a second state to electrically disconnect the signal path from the clamp voltage wherein in the second state at least one of the n-channel transistor and the p-channel transistor is configured to block conduction when the voltage at said node of the signal path is positive and at least the other of the n-channel transistor and the p-channel transistor is configured to block conduction when the voltage at said node of the signal path is negative.

18. Voltage clamping circuitry as claimed in claim 17:
wherein said n-channel transistor is coupled to a node of the audio signal path; and
wherein said p-channel transistor is coupled between the n-channel transistor and a clamp voltage node;
wherein a source terminal of said n-channel transistor is electrically connected to a source terminal of said p-channel transistor;
wherein a bulk terminal of the n-channel transistor is electrically connected to the source terminal of the n-channel transistor; and
wherein a bulk terminal of the p-channel transistor is electrically connected to the clamp voltage node; and wherein
the voltage clamping circuitry further comprises a controller configured to generate a control signal to drive a gate terminal of the n-channel transistor and to generate a control signal to drive a gate terminal of the p-channel transistor.

19. Voltage clamping circuitry as claimed in claim 17:
wherein said p-channel transistor is coupled to a node of the audio signal path; and
wherein said n-channel transistor is coupled between the p-channel transistor and a clamp voltage node;

wherein a source terminal of said p-channel transistor is electrically connected to a source terminal of said n-channel transistor;
wherein a bulk terminal of the p-channel transistor is electrically connected to the source terminal of the p-channel transistor; and
wherein a bulk terminal of the n-channel transistor is electrically connected to the clamp voltage node; and wherein
the voltage clamping circuitry further comprises a controller configured to generate a control signal to drive a gate terminal of the n-channel transistor and to generate a control signal to drive a gate terminal of the p-channel transistor.

* * * * *

UNITED STATES PATENT AND TRADEMARK OFFICE
CERTIFICATE OF CORRECTION

PATENT NO. : 10,142,721 B2
APPLICATION NO. : 15/439323
DATED : November 27, 2018
INVENTOR(S) : Rupesh Khare Page 1 of 1

It is certified that error appears in the above-identified patent and that said Letters Patent is hereby corrected as shown below:

On the Title Page

In Column 1, below Item "(65)":
Insert -- Related U.S. Application Data
(60) Provisional application No. 62/300,587, filed on Feb. 26, 2016. --.

Signed and Sealed this
Ninth Day of April, 2019

Andrei Iancu
*Director of the United States Patent and Trademark Office*